(12) United States Patent
Tang

(10) Patent No.: US 8,010,864 B2
(45) Date of Patent: Aug. 30, 2011

(54) PARAMETER SETTING WITH ERROR CORRECTION FOR ANALOG CIRCUITS

(75) Inventor: Andrew T. K. Tang, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 977 days.

(21) Appl. No.: 11/978,061

(22) Filed: Oct. 26, 2007

(65) Prior Publication Data

US 2008/0104472 A1 May 1, 2008

Related U.S. Application Data

(60) Provisional application No. 60/854,935, filed on Oct. 26, 2006.

(51) Int. Cl.
*H03M 13/00* (2006.01)
(52) U.S. Cl. .......................................... 714/752; 714/777
(58) Field of Classification Search .................. 714/724, 714/746, 740, 799, 819, 777, 800, 751, 752
See application file for complete search history.

(56) References Cited

U.S. PATENT DOCUMENTS

| | | | | |
|---|---|---|---|---|
| 4,612,640 A | * | 9/1986 | Mehrotra et al. | 714/766 |
| 4,631,725 A | * | 12/1986 | Takamura et al. | 714/752 |
| 5,127,014 A | * | 6/1992 | Raynham | 714/754 |
| 5,394,407 A | * | 2/1995 | Coddington | 714/752 |
| 5,961,660 A | * | 10/1999 | Capps et al. | 714/763 |
| 7,020,811 B2 | * | 3/2006 | Byrd | 714/703 |

OTHER PUBLICATIONS

Analog Devices, "Digitally Programmable Sensor Signal Amplifier With EMI Filters", AD8556, Revision 0: Initial Version, May 2005, pp. 1-28.

* cited by examiner

*Primary Examiner* — Phung M Chung
(74) *Attorney, Agent, or Firm* — Koppel, Patrick, Heybl & Philpott

(57) ABSTRACT

A system and method for setting analog circuit parameters requires providing a first set of data bits which represent the parameters to be set, deriving a first set of error correction bits from the values of the data bits in accordance with a predefined algorithm which enables the detection of at least one data bit error, receiving the data bits and error correction bits, deriving a second set of error correction bits from the values of the received bits in accordance with the predefined algorithm, comparing the first and second sets of error correction bits to detect the presence of data bit errors in the received data bits, correcting the data bit errors in the received data bits, and providing the corrected received data bits to the at least one analog circuit.

16 Claims, 6 Drawing Sheets

US 8,010,864 B2

PARAMETER SETTING WITH ERROR CORRECTION FOR ANALOG CIRCUITS

RELATED APPLICATIONS

This application claims the benefit of provisional patent application No. 60/854,935 to A. Tang, filed Oct. 26, 2007.

BACKGROUND OF THE INVENTION

1. Field of the Invention

This invention relates generally to parameter setting means for analog circuits, and more particularly to a parameter setting means which includes error correction for setting one or more analog circuit parameters.

2. Description of the Related Art

Memory devices are increasingly used in analog circuits to configure their behavior. Such circuits have associated parameters, and are arranged such that one or more of their parameters can be set via the application of a digital input word, the bits of which are stored in the memory device. Examples include setting the gain and/or offset of an amplifier, setting the cut-off frequency of a filter, calibrating an analog-to-digital converter (ADC) or digital-to-analog converter (DAC), defining an input-to-output characteristic for non-linear amplification, and defining the temperature behavior for temperature dependent gain.

In such systems, the memory device is a potential source of error. If a floating-gate memory (such as an EEPROM) is used, charge can leak away from a floating gate, eventually causing the stored data to be corrupted. If fuses are used for the memory, high electric fields across small gaps could cause material transport, eventually causing blown fuses to be detected as unblown. If latches, registers or RAM cells are used, radiation could cause the memory cell state to flip. In all of these cases, the parameter established by the stored data would change, causing the analog circuit to function differently than it would if there were no errors.

FIG. 1 shows an example of a circuit in which the gain of an amplifier 10 is set via the application of four data bits to amplifier gain inputs G[3], G[2], G[1] and G[0] (abbreviated herein as G[3:0]). The data bits are provided by a memory device 12, the outputs of which (D[3:0]) are connected to gain inputs G[3:0]. If one or more bits of the memory are corrupted, the resulting gain will be different from that programmed. This memory corruption is not detectable, so no warning can be given if the gain setting is changed from the programmed value.

SUMMARY OF THE INVENTION

A system and method for setting analog circuit parameters is presented, which includes an error correction function that allows the originally programmed data to be applied to the analog circuit even if individual bits of the memory become corrupted.

The present parameter setting scheme is used for setting one or more parameter values for at least one analog circuit, each of which has at least one associated parameter that is set in response to the application of a plurality of data bits. The scheme requires:

providing a first set of data bits which represent the parameters to be set;
deriving a first set of error correction bits from the values of the first set of data bits in accordance with a predefined algorithm which enables the detection of at least one data bit error;
receiving the first set of data bits and first set of error correction bits;
deriving a second set of error correction bits from the values of the received data bits in accordance with the predefined algorithm;
comparing the first and second sets of error correction bits to detect the presence of data bit errors in the received data bits;
if possible, correcting the data bit errors in the received data bits; and
providing the corrected received data bits to the at least one analog circuit.

The predefined algorithm preferably enables the correction of a single-bit error in the received set of data bits, and the detection of double-bit errors. The scheme can be used to provide data bits that set multiple parameters, and/or to set parameters for multiple circuits.

These and other features, aspects, and advantages of the present invention will become better understood with reference to the following drawings, description, and claims.

BRIEF DESCRIPTION OF THE DRAWINGS

FIGS. 3b and 3c show details of the multiplexer cell used in the circuit of FIG. 3a.

DETAILED DESCRIPTION OF THE INVENTION

The present parameter setting scheme is designed for use with analog circuitry having associated parameters, at least one of which can be set by means of a digital bit pattern applied to an input. The digital bit pattern is programmed into a memory device. The scheme includes an error correction function, which allows the originally programmed data to be applied to the analog circuit even if individual bits of the memory become corrupted.

Figure 1:
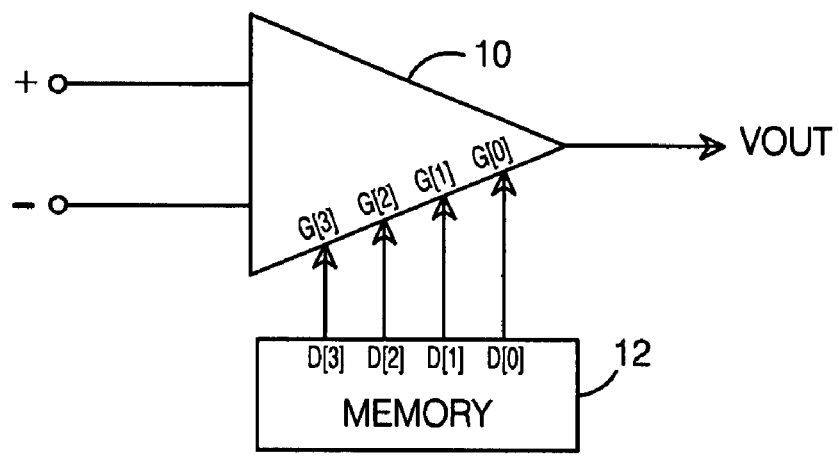
FIG. 1 is a block diagram of a known scheme for setting the parameters of an analog circuit.
Figure 2:
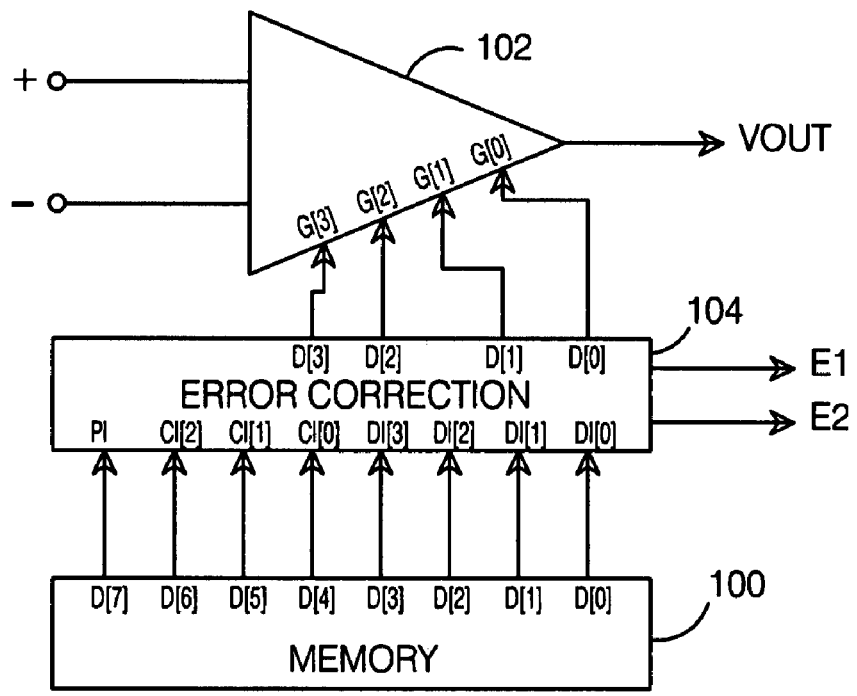
FIG. 2 is a block diagram of one possible embodiment of a parameter setting scheme in accordance with the present invention.

One possible embodiment of the present parameter setting scheme is shown in FIG. 2. In this example, a memory device 100 is programmed with eight bits of data. The memory holds four data bits—D[3], D[2], D[1], D[0] (abbreviated herein as D[3:0])—which are used indirectly to set the gain of an amplifier 102 which is arranged such that its gain varies with the values of the data bits applied to its gain inputs G[3], G[2], G[1], G[0] (G[3:0]). Three additional bits in memory—D[6], D[5], D[4] (D[6:4])—are "error correction bits". The values of D[6:4] are derived from the values of D[3:0] in accordance with a predefined algorithm which enables the detection of at least one data bit error. The present scheme preferably also employs a parity bit along with the data and error correction bits; in the exemplary embodiment shown in FIG. 2, this bit is stored in memory device 100 as D[7], and is defined as:

$$D[7]=XOR(D[0],D[1],D[2],D[3],D[4],D[5],D[6]).$$

An error correction circuit 104 is connected between memory device 100 and amplifier 102. Error correction circuit 104 receives the memory device's data bits D[3:0] at respective inputs DI[3:0], receives the memory device's error correction bits D[6:4] at respective inputs CI[2:0], and receives parity bit D[7] at an input PI. The error correction circuit is arranged to:

derive a second set of error correction bits (CC[2:0]) from the values of received data bits DI[3:0] in accordance with the predefined algorithm, compare CI[2:0] to CC[2:0] to detect the presence of a data bit error in DI[3:0], if possible, correct a detected data bit error, and provide the corrected received data bits to the gain inputs of amplifier 102; these output bits are identified as DO[3:0]. In this way, the gain of amplifier 102 remains at the programmed value even if a single-bit error is present in the data bits received by error correction circuit 104.

The predefined algorithm used to derive the error correction bits is preferably capable of detecting and correcting at least a single-bit error. One possible algorithm that could be used in the example above is an enhanced Hamming (7,4) code, which includes four data bits and three error correction bits, and which can detect and correct a single-bit error.

In accordance with an enhanced Hamming (7,4) code, the error correction bits stored in memory device 100 are derived from the four data bits which are to be applied to the analog circuit. For the equations shown below, it is assumed that stored bits D[3:0] are equal to these four bits. The stored error correction bits D[6:4] are given by:

$$D[4]=XOR(D[0],D[1],D[3]),$$

$$D[5]=XOR(D[0],D[2],D[3]), \text{ and}$$

$$D[6]=XOR(D[1],D[2],D[3]),$$

wherein XOR is the exclusive-OR function. When received by error correction circuit 104, bits D[6:4] are identified as CI[2:0], respectively.

Error correction circuit 104 is arranged to calculate its own set of error correction bits, based on the values of received data bits DI[3:0]; the same algorithm is used. These error correction bits are designated CC[2:0], and are given by:

$$CC[0]=XOR(DI[0],DI[1],DI[3]),$$

$$CC[1]=XOR(DI[0],DI[2],DI[3]), \text{ and}$$

$$CC[2]=XOR(DI[1],DI[2],DI[3]),$$

When so arranged, a single-bit error is detected by calculating EP[2:0] which is given by:

$$EP[0]=XOR(CI[0],CC[0]),$$

$$EP[1]=XOR(CI[1],CC[1]), \text{ and}$$

$$EP[2]=XOR(CI[2],CC[2]).$$

An error signal E1 can be calculated using the OR function:

$$E1=OR(EP[0],EP[1],EP[2]).$$

If the four data bits are received accurately, error correction bits CI[2:0] will be equal to the calculated error correction bits CC[2:0], so error position bits EP[2:0] are all 0, and E1 is also 0, indicating no single-bit error. However, if there is a single-bit error, one or more bits of the vector EP[2:0] will be 1, so E1 will also be 1.

The bit position of a single-bit error can also be determined by this method. The vector EP[2:0] indicates the index of the corrupted data bit in a word W[7:0] given by:

$$W[7:5]=DI[3:1],$$

$$W[4]=CI[2],$$

$$W[3]=DI[0],$$

$$W[2:1]=CI[1:0], \text{ and}$$

$$W[0]=PI.$$

The corrupted bit is corrected by inverting it such that W[EP[2:0]]=NOT(W[EP[2:0]]). After correction (if a single-bit error has occurred), the data output is assigned in the following way:

$$DO[3:1]=W[7:5]$$

$$DO[0]=W[3]$$

If a single-bit error has not occurred (i.e., if E1 has been evaluated to be 0), then DO[3:0] is set equal to DI[3:0].

Error correction circuit 104 can also calculate an error signal E2, which indicates when a double-bit error has occurred. First, circuit 104 calculates a parity bit PC based on the received bits:
PC=XOR(DI[0],DI[1],DI[2],DI[3],CI[0],CI[1],CI[2]).
Then, E2 is given by:

$$E2=XOR(E1,PI,PC).$$

Note that the present error scheme corrects errors that result from the corruption of a data bit as stored in the memory device, or from a data bit error that occurs during the transmission of the bit. As noted above, the error correction bits are derived from the data bits which are to be applied to the analog circuit; as such, if one of the stored data bits is corrupted, stored bits D[3:0] will differ from the data bits which are to be applied to the analog circuit.

Figure 3A:
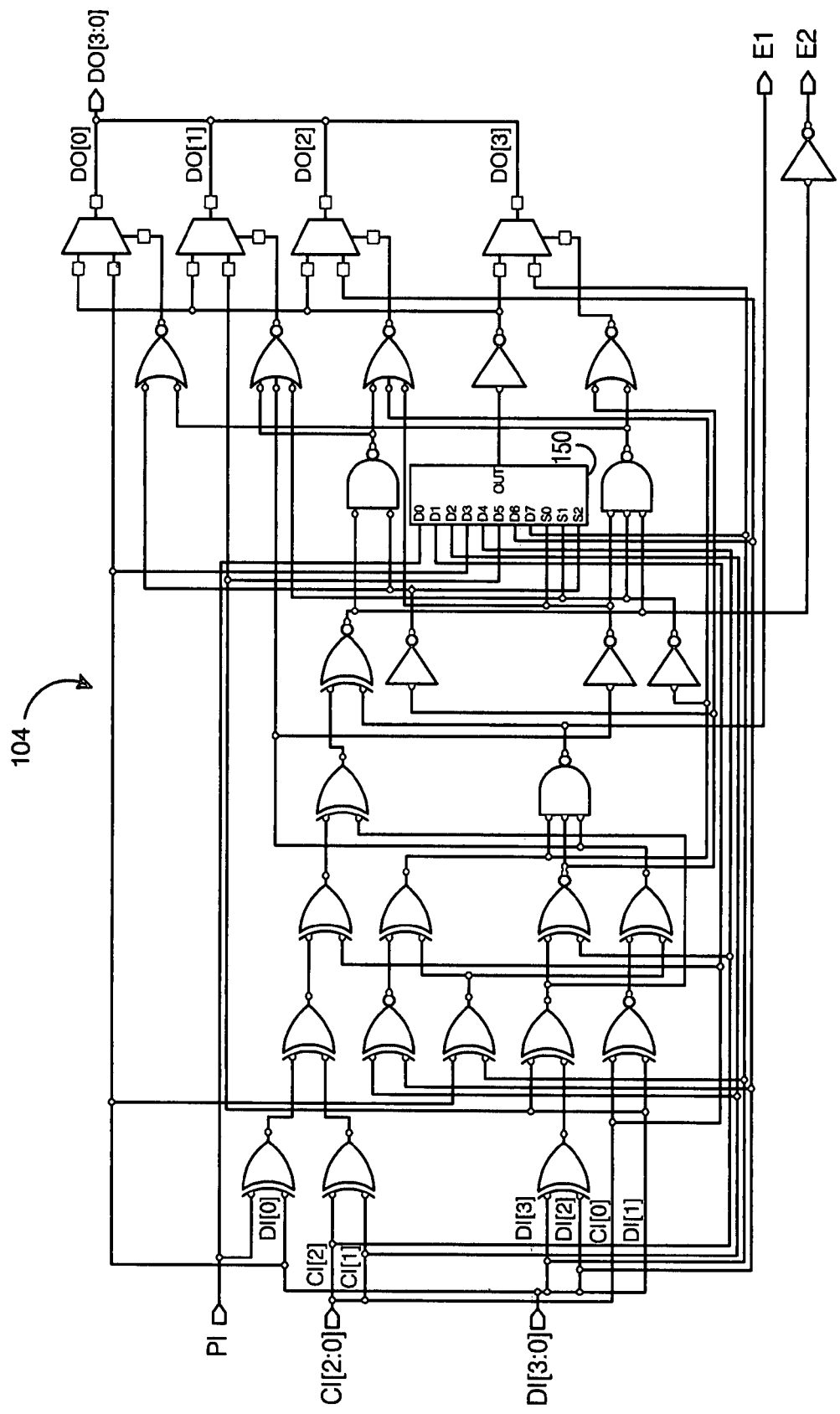
FIG. 3a is one possible implementation of an error correction circuit that might be used in a parameter setting scheme per the present invention.
Figure 3C:
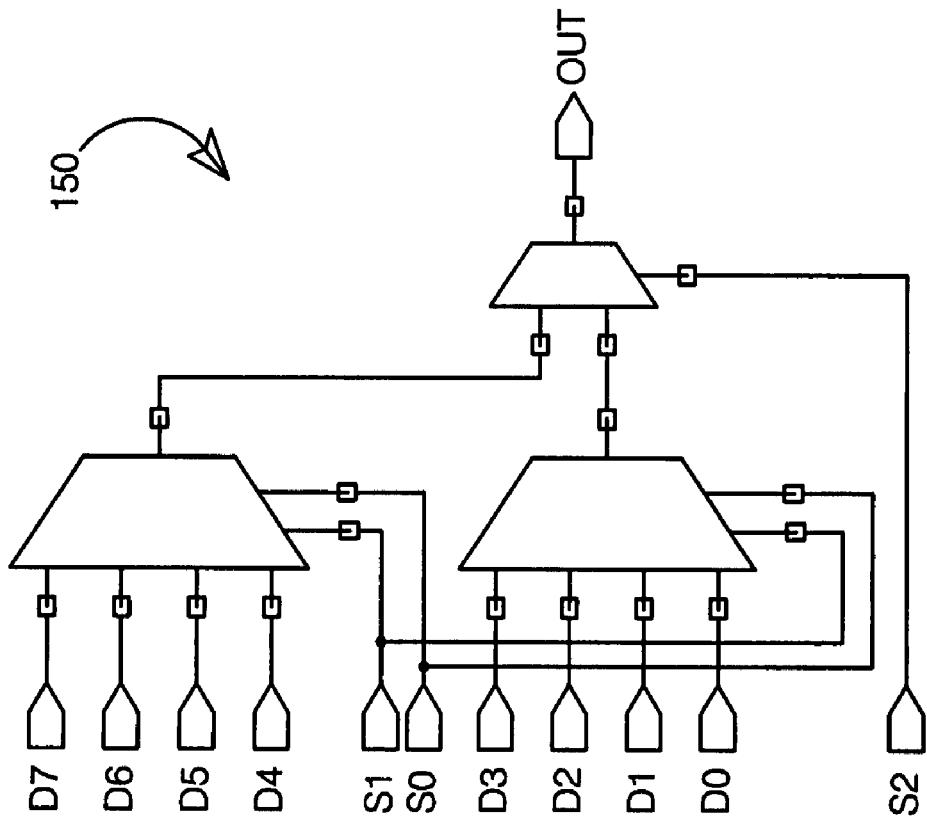
Figure 3B:
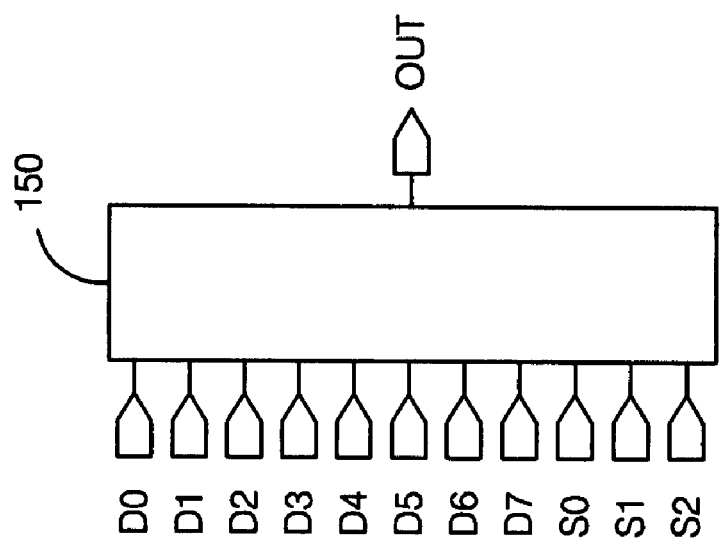

One possible implementation of an error correction circuit as shown in FIG. 2 is shown in FIGS. 3a-3c. The circuit comprises combinatorial logic elements, which includes a multiplexer cell 150. Details of multiplexer cell 150 are shown in FIGS. 3b and 3c.

An example of using the circuits shown in FIGS. 2 and 3a-3c follows. Assume that a user wishes to configure amplifier 102 by applying a gain code of 1010 at amplifier inputs G[3:0]. To do this, memory bits D[3:0] would be set to 1010. Following the Hamming code algorithm, memory bit D[4] is set to XOR (D[3],D[1],D[0]), which would have a value of 0 for the 1010 input. Similarly, memory bit D[5] would be set to XOR(D[3],D[2],D[0]) (value 1); memory bit D[6] would be set to XOR(D[3],D[2],D[1]) (value 0); and memory bit D[7] would be set to XOR(D[6],D[5],D[4],D[3],D[2],D[1],D[0]) (value 1).

The operation of an error correction circuit as described above is illustrated in Table 1. Case 1 shows the programmed condition with no memory corruption: the data outputs DO[3:0] are the same as the data inputs DI[3:0]. Cases 2, 3, 4 and 5 show the effect of a single-bit corruption of data bits DI[0], DI[1], DI[2] and DI[3], respectively. However, error correction circuit 104 corrects for these single-bit errors as described above, such that its outputs DO[3:0] are the same as the programmed value, but the signal E1 has changed to 1.

Case 6 shows the effect of a double-bit corruption: the data outputs are now different from the programmed value, and both the E1 and E2 signals have a value of 1.

TABLE 1

Simulation of error correction circuit

| Case | PI | CI[2] | CI[1] | CI[0] | DI[3] | DI[2] | DI[1] | DI[0] | DO[3] | DO[2] | DO[1] | DO[0] | E1 | E2 |
|---|---|---|---|---|---|---|---|---|---|---|---|---|---|---|
| 1 | 1 | 0 | 1 | 0 | 1 | 0 | 1 | 0 | 1 | 0 | 1 | 0 | 0 | 0 |
| 2 | 1 | 0 | 1 | 0 | 1 | 0 | 1 | 1 | 1 | 0 | 1 | 0 | 1 | 0 |
| 3 | 1 | 0 | 1 | 0 | 1 | 0 | 0 | 0 | 1 | 0 | 1 | 0 | 1 | 0 |
| 4 | 1 | 0 | 1 | 0 | 1 | 1 | 1 | 0 | 1 | 0 | 1 | 0 | 1 | 0 |
| 5 | 1 | 0 | 1 | 0 | 0 | 0 | 1 | 0 | 1 | 0 | 1 | 0 | 1 | 0 |
| 6 | 1 | 0 | 1 | 0 | 1 | 1 | 1 | 1 | 1 | 1 | 1 | 1 | 1 | 1 |

Figure 4:
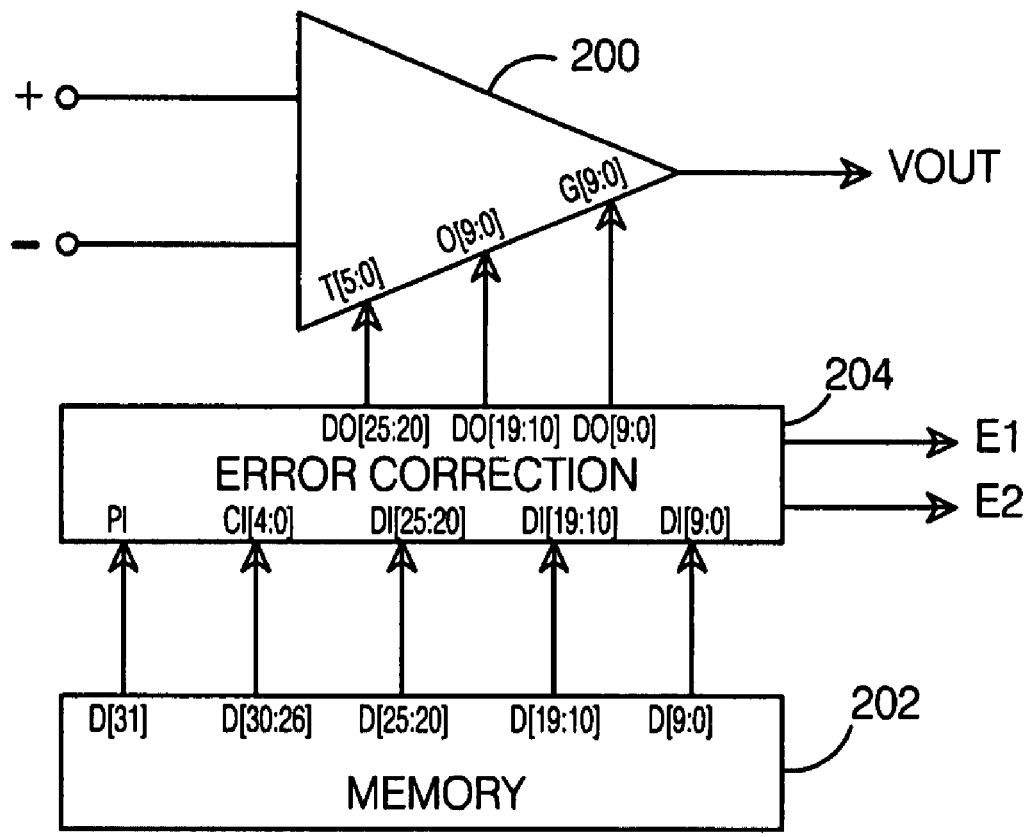
FIG. 4 is a block diagram of one possible embodiment of a parameter setting scheme in accordance with the present invention in which multiple parameters are set for a single analog circuit.

Another exemplary application of the present parameter setting scheme is shown in FIG. 4, in which the gain (G[9:0]), offset O[9:0] and temperature coefficient T[5:0] of an amplifier 200 are set by 26 bits (D[25:0]) stored in a memory device 202. The memory device also stores 6 bits D[31:26] for error correction, one of which is a parity bit. An error correction circuit 204 has data inputs DI[25:0] which receive the gain, offset, and temperature coefficient bits, correction bit inputs CI[4:0], and a parity input PI. The error correction circuit provides data outputs DO[25:0] and error signals E1 and E2.

Error correction circuit 204 uses exclusive-or functions to calculate internal correction bits CC[4:0] as follows:

$CC[0]=XOR(DI[0],DI[1],DI[3],DI[4],DI[6],DI[8],DI[10],DI[11],DI[13],DI[15],DI[17],DI[19],DI[21],DI[23],DI[25])$.

$CC[1]=XOR(DI[0],DI[2],DI[3],DI[5],DI[6],DI[9],DI[10],DI[12],DI[13],DI[16],DI[17],DI[20],DI[21],DI[24],DI[25])$.

$CC[2]=XOR(DI[1],DI[2],DI[3],DI[7],DI[8],DI[9],DI[10],DI[14],DI[15],DI[16],DI[17],DI[22],DI[23],DI[24],DI[25])$.

$CC[3]=XOR(DI[4],DI[5],DI[6],DI[7],DI[8],DI[9],DI[10],DI[18],DI[19],DI[20],DI[21],DI[22],DI[23],DI[24],DI[25])$.

$CC[4]=XOR(DI[11],DI[12],DI[13],DI[14],DI[15],DI[16],DI[17],DI[18],DI[19],DI[20],DI[21],DI[22],DI[23],DI[24],DI[25])$.

Error correction circuit 204 also calculates an internal parity value PC:

$PC=XOR(DI[0],DI[1],DI[2],DI[3],DI[4],DI[5],DI[6],DI[7],DI[8],DI[9],DI[10],DI[11],DI[12],DI[13],DI[14],DI[15],DI[16],DI[17],DI[18],DI[19],DI[20],DI[21],DI[22],DI[23],DI[24],DI[25],CI[0],CI[1],CI[2],CI[3],CI[4])$.

An error position is calculated as the exclusive-or of the input correction bits and the calculated correction bits:

$EP[0]=XOR(CI[0],CC[0])$, $EP[1]=XOR(CI[1],CC[1])$, $EP[2]=XOR(CI[2],CC[2])$, $EP[3]=XOR(CI[3],CC[3])$, and $EP[4]=XOR(CI[4],CC[4])$, and an error signal is calculated using an OR function of the error position bits:

$E1=OR(EP[0],EP[1],EP[2],EP[3],EP[4])$.

If there is no memory corruption, correction bits CI[4:0] received from memory device 202 are equal to the internally-calculated correction bits CC[4:0]. This results in signals EP[4:0] all being 0, and E1 is also 0, indicating no single-bit error.

However, if there is a single-bit error, one or more bits of vector EP[4:0] are 1, so E1 is also 1. The vector EP[4:0] indicates the index of the corrupted bit in a word W, constructed as:

$W[31:17]=DI[25:11]$, $W[16]=CI[4]$, $W[15:9]=DI[10:4]$, $W[8]=CI[3]$, $W[7:5]=DI[3:1]$, $W[4]=CI[2]$, $W[3]=DI[0]$, $W[2:1]=CI[1:0]$, and $W[0]=PI$.

To correct a single-bit error, the bit in error is inverted, such that $W[EP[4:0]]=NOT(W[EP[4:0]])$. E2 indicates whether a double-bit error has occurred: $E2=XOR(E1, PI, PC)$. After correction (if a single-bit error has occurred), data output bits DO[25,0] are assigned in the following way:

$DO[25:11]=W[31:17]$, $DO[10:4]=W[15:9]$, $DO[3:1]=W[7:5]$, $DO[0]=W[3]$.

Figure 5:
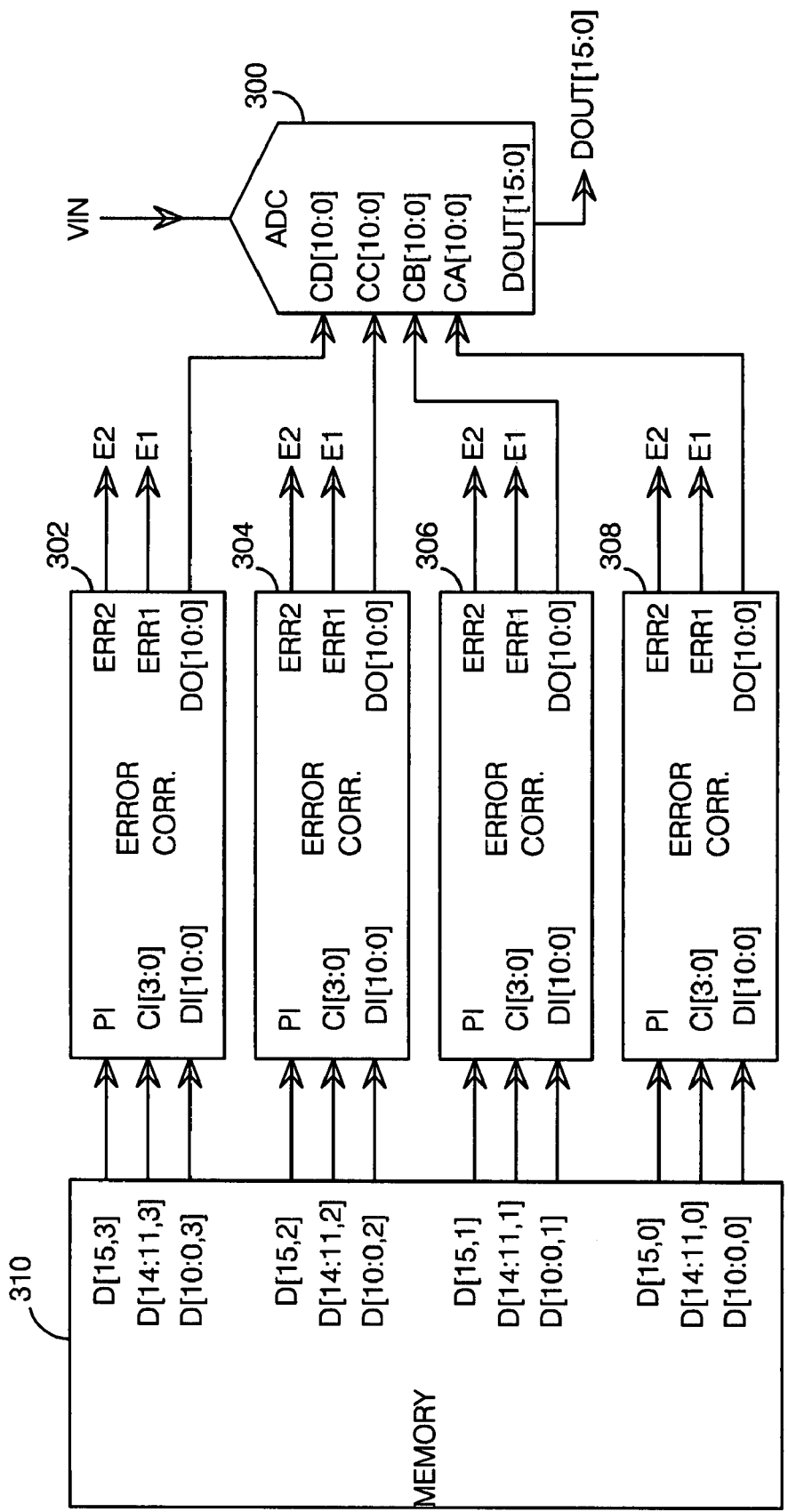
FIG. 5 is a block diagram of one possible embodiment of a parameter setting scheme in accordance with the present invention in which multiple error correction circuits are employed to set multiple parameters for a single analog circuit.

Another possible application of the present scheme is shown in FIG. 5, in which multiple error correction circuits are used to provide respective parameter settings. This approach might be taken when a large number of data bits are needed. For example, to calibrate a high-resolution analog-to-digital converter (ADC) 300, multiple error correction circuits (302, 304, 306, 308) could be used to provide respective calibration settings (CA[10:0],CB[10:0],CC[10:0],CD[10:0]).

Here, a memory device 310 is configured as a 2-dimensional array containing four 16-bit words. Each word is connected to a separate error correction circuit 302, 304, 306, 308, each of which drives one of the calibration inputs of ADC 300. Using multiple error correction circuits instead of a single large one allows the correction of multiple-bit errors, but at the expense of more memory bits needed for error correction. This approach can also reduce the wiring complexity in some situations.

Figure 6:
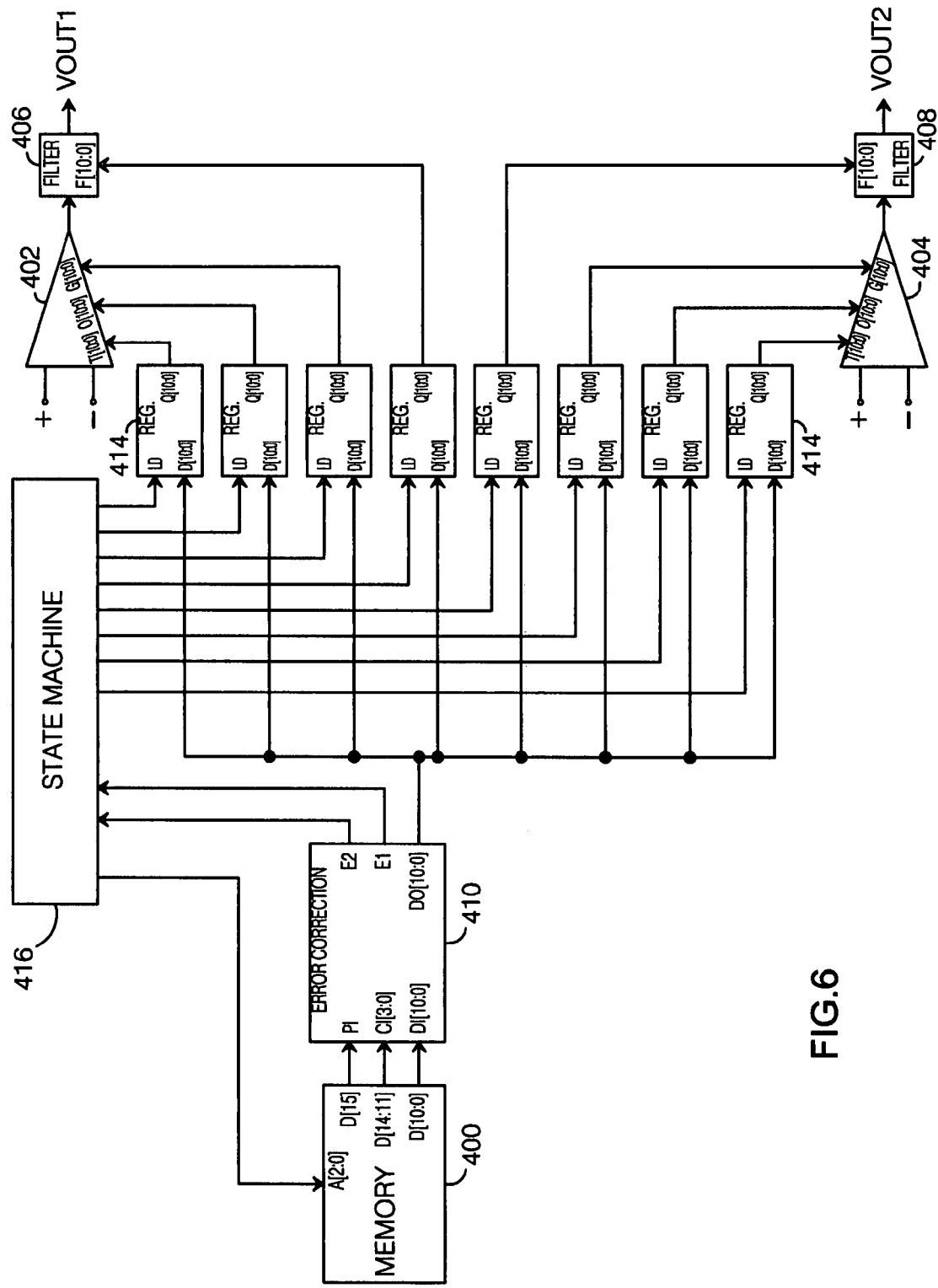
FIG. 6 is a block diagram of one possible embodiment of a parameter setting scheme in accordance with the present invention in which multiple parameters for multiple analog circuits are set.

Another possible application is shown in FIG. 6, in which a state machine is used to perform error correction sequentially using a single error correction circuit. This can be efficient if the memory is arranged as multiple words. FIG. 6 shows an example in which a non-volatile memory array 400 is used to set the gain, offset and temperature coefficient of two amplifiers 402, 404, as well as the corner frequency of two filters 406, 408.

The parameter settings are stored in memory array 400, which is arranged as 8 words of 16 bits each. The D[15:0] signals are the outputs from the memory array, and the A[2:0] inputs are the array's address inputs to select a single 16-bit word to be output. An error correction circuit 410 receives the data bits (D[10:0]) representing parameters at its inputs DI[10:0], the correction bits (D[14:11]) derived from the data bits at inputs CI[14:11], and a parity bit D[15] at input PI, and produces the parameter setting bits at its outputs DO[10:0].

When a system employing these components is powered up, the 8 words stored in memory device 400 need to be transferred to respective registers or latches 414, which then apply the stored values to the amplifiers and filters. A state machine 416 sequentially selects each word from memory array 400, error correction circuit 410 applies the error correction algorithm, and the state machine loads the error-corrected words into the appropriate register for application to the appropriate inputs on the amplifiers and filters.

Note that the concept of using error correction for correcting memory errors in analog circuits is not limited to the examples shown, nor limited to using Hamming codes for error correction.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A parameter setting system, comprising:
   at least one analog circuit, each of which has at least one associated parameter that is set in response to a plurality of data bits provided to said circuit, comprising:
   a memory device which stores:
      a plurality of data bits representing said at least one parameter to be set; and
      a first set of error correction bits derived from the values of said data bits in accordance with a predefined algorithm which enables the detection of at least one data bit error; and
   at least one error correction circuit connected between said memory device and said at least one analog circuit, said at least one error correction circuit arranged to:
      receive said data bits and said first set of error correction bits;
      derive a second set of error correction bits from the values of said received data bits in accordance with said predefined algorithm;
      compare said first and second sets of error correction bits to detect the presence of said at least one data bit error in said received data bits;
      correct said at least one data bit error in said received data bits if detected; and
      provide said corrected received data bits to said at least one analog circuit to set said at least one associated parameter.

2. The system of claim 1, wherein said memory device further stores at least one parity bit derived from the values of said data bits and said first set of error correction bits, and said at least one error correction circuit is further arranged to derive at least one parity bit from the values of said received data bits and said received first set of error correction bits.

3. The system of claim 1, wherein said predefined algorithm enables the correction of a single-bit error in said received data bits.

4. The system of claim 1, wherein said predefined algorithm is a Hamming code which enables the correction of single-bit errors and the detection of double-bit errors in said received data bits.

5. The system of claim 4, wherein said data bits comprises four bits D[3:0], said data bits D[3:0] received by said error correction circuit as four bits DI[3:0], respectively, said first set of error correction bits comprises 3 bits D[6:4], the values of which are given by:

$$D[4]=XOR(D[0],D[1],D[3]),$$

$$D[5]=XOR(D[0],D[2],D[3]), \text{ and}$$

D[6]=XOR(D[1], D[2], D[3]), said bits D[6:4] received by said error correction circuit as bits CI[2:0], respectively, and said second set of error correction bits comprises 3 bits CC[2:0], the values of which are given by:

$$CC[0]=XOR(DI[0],DI[1],DI[3]),$$

$$CC[1]=XOR(DI[0],DI[2],DI[3]), \text{ and}$$

$$CC[2]=XOR(DI[1],DI[2],DI[3]),$$

wherein XOR is the exclusive-OR function.

6. The system of claim 5, wherein the position of a single-bit error is determined by calculating EP[2:0] which is given by:

$$EP[0]=XOR(CI[0],CC[0]),$$

$$EP[1]=XOR(CI[1],CC[1]), \text{ and}$$

$$EP[2]=XOR(CI[2],CC[2]),$$

such that the vector EP[2:0] indicates the index of the corrupted data bit in a word W[7:0] given by:

$$W[7:5]=DI[3:1],$$

$$W[4]=CI[2],$$

$$W[3]=DI[0],$$

$$W[2:1]=CI[1:0], \text{ and}$$

$$W[0]=PI,$$

where PI is given by:

$$PI=XOR(DI[0],DI[1],DI[2],DI[3],CI[0],CI[1],CI[2]),$$

and said corrupted bit is corrected by inverting it such that W[EP[2:0]]=NOT(W[EP[2:0]]).

7. The system of claim 1, wherein said at least one analog circuit has x associated parameters that are set in response to a respective sets of data bits provided to said analog circuit, wherein x>1, said memory device arranged to store each of said sets of data bits.

8. The system of claim 1, wherein said at least one analog circuit has x associated parameters that are set in response to a respective sets of data bits provided to said analog circuit, wherein x>1, said memory device arranged to store each of said sets of data bits and said system comprising x of said error correction circuits, each of which is arranged to provide a respective one of said sets of data bits to said analog circuit and to correct single-bit errors in their respective sets of data bits.

9. The system of claim 8, wherein said memory device stores said sets of data bits in a two-dimensional array.

10. The system of claim 9, further comprising a state machine which is coupled to said memory device and arranged to cause said sets of data bits to be provided to said error correction circuit sequentially.

11. The system of claim 1, wherein said at least one analog circuit has x associated parameters that are set in response to a respective sets of data bits provided to said analog circuit, wherein x>1, said memory device arranged to store each of said sets of data bits, said system arranged to:
   provide said sets of data bits to one of said error correction circuits sequentially;
   store the sets of corrected received data bits produced by said error correction circuit; and
   provide said stored sets of corrected received data bits to said at least one analog circuit.

12. The system of claim 11, wherein said at least one error correction circuit consists of one error correction circuit.

13. The system of claim 11, wherein said sets of corrected received data bits produced by said error correction circuit are stored in respective registers.

14. A method of setting one or more parameter values for at least one analog circuit, each of which has at least one associated parameter that is set in response to a plurality of data bits provided to said circuit, comprising:
   providing data bits which represent said at least one parameter to be set;
   calculating a first set of error correction bits derived from the values of said data bits in accordance with a predefined algorithm which enables the detection of at least one data bit error; and
   receiving said data bits and said first set of error correction bits;
   deriving a second set of error correction bits from the values of said received data bits in accordance with said predefined algorithm;
   comparing said first and second sets of error correction bits to detect the presence of said at least one data bit error in said received data bits;
   correcting said at least one data bit error in said received data bits if detected; and
   providing said corrected received data bits to said at least one analog circuit.

15. The method of claim 14, wherein said predefined algorithm enables the correction of a single-bit error in said received set of data bits.

16. The method of claim 14, wherein said predefined algorithm is a Hamming code which enables the correction of single-bit errors and the detection of double-bit errors in said received set of data bits.

* * * * *

UNITED STATES PATENT AND TRADEMARK OFFICE
CERTIFICATE OF CORRECTION

PATENT NO.       : 8,010,864 B2                              Page 1 of 1
APPLICATION NO.  : 11/978061
DATED            : August 30, 2011
INVENTOR(S)      : Andrew T. K. Tang It is certified that error appears in the above-identified patent and that said Letters Patent is hereby corrected as shown below:

Col. 1, under "Related Applications" provisional patent application filing date should be Oct. 26, --2006--

Signed and Sealed this
Eighteenth Day of October, 2011

David J. Kappos
*Director of the United States Patent and Trademark Office*